(12) United States Patent
Oman et al.

(10) Patent No.: US 8,438,862 B2
(45) Date of Patent: May 14, 2013

(54) THERMALLY-PROTECTED CHAMBER FOR A TEMPERATURE-SENSITIVE CONSUMER ELECTRONIC DEVICE

(75) Inventors: Todd P. Oman, Greentown, IN (US); Craig A. Tieman, Westfield, IN (US); Michel F. Sultan, Troy, MI (US); Dale L. Partin, Ray Township, MI (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 869 days.

(21) Appl. No.: 12/606,245

(22) Filed: Oct. 27, 2009

(65) Prior Publication Data

US 2011/0094725 A1      Apr. 28, 2011

(51) Int. Cl.
*F25B 21/02*     (2006.01)
*B60H 3/00*      (2006.01)
*B60H 1/00*      (2006.01)

(52) U.S. Cl.
USPC ............... 62/3.61; 62/3.2; 62/3.6; 165/42; 165/202

(58) Field of Classification Search ......... 62/3.2, 62/3.6, 3.61; 165/42, 202; 340/426
See application file for complete search history.

(56) References Cited

U.S. PATENT DOCUMENTS

| | | | |
|---|---|---|---|
| 5,603,220 A * | 2/1997 | Seaman | 62/3.7 |
| 6,134,906 A | 10/2000 | Eastman | |
| 6,282,906 B1 * | 9/2001 | Cauchy | 62/3.3 |
| 7,073,338 B2 | 7/2006 | Harwood et al. | |
| 7,081,677 B2 | 7/2006 | Yamashita et al. | |
| 2005/0178128 A1 * | 8/2005 | Harwood et al. | 62/3.61 |
| 2006/0110657 A1 * | 5/2006 | Stanton et al. | 429/120 |
| 2009/0275362 A1 * | 11/2009 | Tieman et al. | 455/556.1 |

FOREIGN PATENT DOCUMENTS

DE        3825141        1/1990

OTHER PUBLICATIONS

European Search Report dated Mar. 20, 2012.

* cited by examiner

*Primary Examiner* — Frantz Jules
*Assistant Examiner* — Keith Raymond
(74) *Attorney, Agent, or Firm* — Thomas N. Twomey

(57) ABSTRACT

A thermal-protection apparatus disposed in a vehicle cabin or storage compartment includes a housing enveloping a chamber in which a thermally-sensitive consumer electronic device is received, a thermoelectric module mounted in a wall of the housing, and a remote electronic controller and power source coupled to the housing via an electrical cable for activating the thermoelectric module, and optionally the consumer electronic device, in a manner to prevent the temperature in the chamber from exceeding a prescribed maximum operating temperature of the consumer electronic device or falling below a prescribed minimum operating temperature of the consumer electronic device.

8 Claims, 3 Drawing Sheets

THERMALLY-PROTECTED CHAMBER FOR A TEMPERATURE-SENSITIVE CONSUMER ELECTRONIC DEVICE

TECHNICAL FIELD

The present invention relates to an apparatus for enabling the use of temperature-sensitive consumer electronic devices in environments subject to temperature extremes, and more particularly to a thermally-protected chamber adapted to house a temperature-sensitive consumer electronic device in a vehicle passenger compartment.

BACKGROUND OF THE INVENTION

Motor vehicles are increasingly being equipped with audio and communication systems adapted to interface with user-provided consumer electronic devices such as MP3 players, cellular phones, and personal digital assistant (PDA) devices. However, the problem with this trend is that vehicle cabins and storage compartments are subject to significant temperature extremes when unattended, and users frequently leave consumer electronic devices in their vehicles. In fact, it can be advantageous to configure a vehicle communication system for continuous interaction with a user-provided communication device such as a cell phone.

While automotive-grade electronic components are designed to withstand a wide temperature range such as $-40°$ C. to $+85°$ C. for reliable operation in an unattended vehicle, most consumer electronic components are designed to a significantly less demanding standard such as $0°$ C. to $+70°$ C. And the batteries typically used in consumer electronic devices (lithium-ion batteries, for example) can pose a particular hazard when exposed to extreme temperatures.

Accordingly, what is needed is way of thermally protecting consumer electronic devices so that they can be reliably and continuously used in a vehicular environment.

SUMMARY OF THE INVENTION

The present invention is directed to a thermal-protection apparatus disposed in a vehicular compartment for enabling safe and reliable operation of a user-provided consumer electronic device even when the compartment experiences temperature extremes beyond the design limits for the consumer electronic device. The apparatus includes a housing enveloping a chamber in which the consumer electronic device is received, a thermoelectric module mounted in a wall of the housing, and a remote electronic controller and power source coupled to the housing via an electrical cable for activating the thermoelectric module, and optionally the consumer electronic device, in a manner to prevent the temperature in the chamber from exceeding a prescribed maximum operating temperature of the consumer electronic device or falling below a prescribed minimum operating temperature of the consumer electronic device. The housing includes an outer jacket of thermally-insulative material, an inner jacket of thermally-conductive material lining the chamber, and a removable panel enabling user-access to the chamber for insertion and removal of the consumer electronic device. The inner jacket is thermally coupled to the thermoelectric module, and the thermoelectric module includes an external heat-sink thermally coupled to ambient air surrounding the housing. The thermally-insulative material and the thermally-conductive material are both radio-frequency energy transmissive to permit unrestricted operation of a consumer electronic device that is capable of radio frequency communication. The housing can be mechanically or magnetically attached to the vehicle interior.

DESCRIPTION OF THE PREFERRED EMBODIMENT

Figure 2:
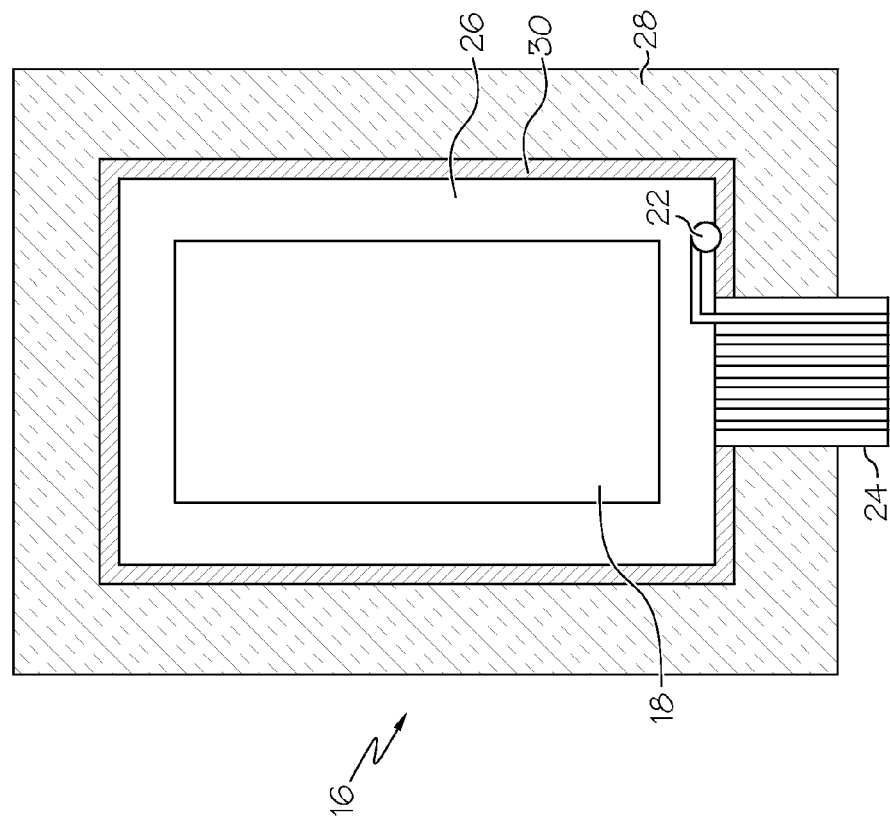
FIG. 2 is an alternate cross-sectional view of the housing and consumer electronic device of FIG. 1.
Figure 1:
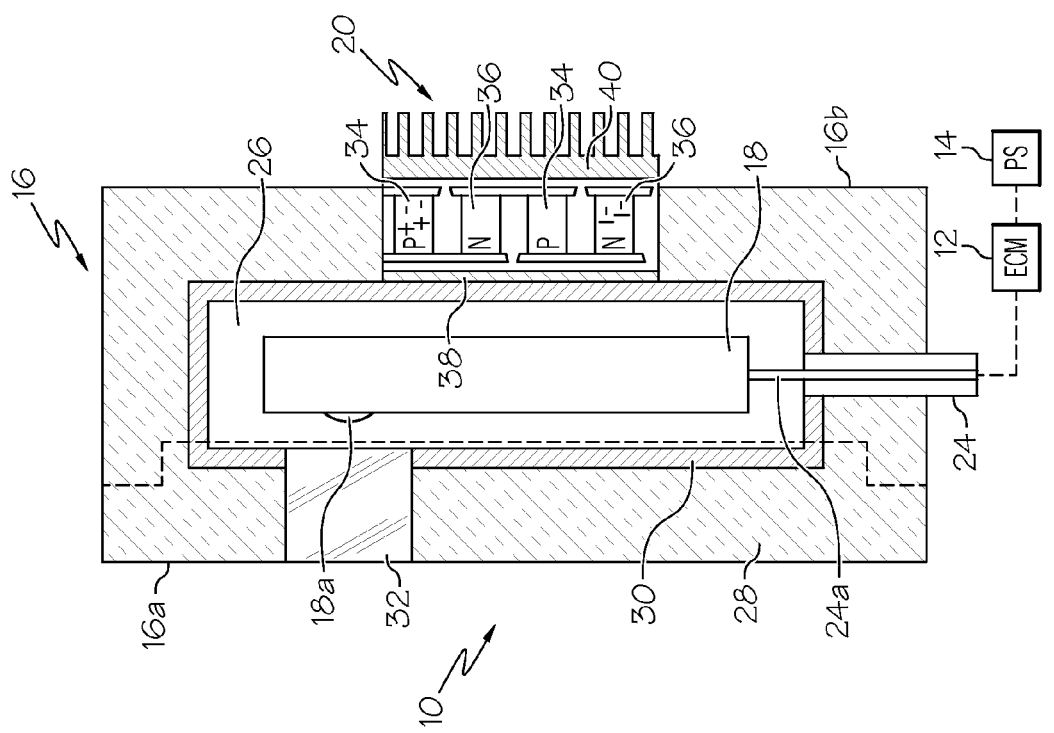
FIG. 1 is a diagram of a thermal protection apparatus according to this invention, including a remote electronic controller and a cross-sectional view of a housing with a user-provided consumer electronic device disposed in a chamber of the housing.

Referring to the drawings, and particularly to FIGS. 1-2, the reference numeral 10 generally designates a vehicle-based thermal protection apparatus according to this invention, including a remote electronic controller and power source 12 and 14, and a housing 16 adapted to receive a user-provided consumer electronic device (CED) 18 such as a cell phone. The electronic controller 12 may be a body computer or other control module normally present in the vehicle, and the power source 14 may be the vehicle storage battery. Typically, the housing 16 will be permanently installed in the vehicle cabin or in a vehicle storage compartment, and is therefore subject to significant temperature extremes, particularly when the vehicle is parked outdoors for an extended period.

The housing 16 is provided with a thermoelectric module (TEM) 20 and a thermistor 22; and a multi-wire electrical cable 24 couples CED 18, TEM 20, thermistor 22 to the electronic controller 12 and power source 14. As explained below, controller 12 activates TEM 20 to limit temperature extremes within the housing 16, and thereby ensure continued safe operation of CED 18 regardless of the ambient temperature in the vehicle cabin or storage compartments. For example, the controller 12 can be programmed to prevent the temperature within housing 16 from exceeding a prescribed maximum operating temperature of CED 18 or falling below a prescribed minimum operating temperature of CED 18. But the electrical cable 24 enables other functionality as well, such as supplying battery-charging current to CED 18 from power source 14 to enable continued operation of CED 18 over an extended period.

The primary rationale for providing a CED-safe housing 16 within a vehicle is to enable continuous operability of the CED 18 when the vehicle is unattended, thereby allowing some of the functionality conventionally performed by expensive factory-installed vehicle systems to be performed by a user-provided CED 18 at much lower cost and with enhanced flexibility. For example, CED 18 may be a cell phone, PDA or other communication device that receives a call placed by the vehicle owner, with commands to carry out various functions such as unlocking the vehicle doors, activating a vehicle alarm system, obtaining the CED's GPS location, or even using an internal camera of the CED 18 to capture a snap-shot or video of the cabin interior and transmit it to the vehicle owner. But even if the CED 18 is not a communication device (an MP3 player, for example), the housing 16 provides a convenient dock for battery charging and interfacing with the vehicle audio or other systems, and for preventing damage to the CED's internal battery when the vehicle is unattended and the cabin or storage compartment experiences extreme temperatures.

Referring again to FIGS. 1-2, the housing 16 envelopes a chamber 26 sufficiently large to accommodate CEDs of various size and shape, and a hook-and-loop or similar fastener may be used to secure CED 18 within the chamber 26. The walls of housing 16 are constructed of an outer jacket 28 of thermally-insulative material such as fiberglass, polyurethane or polystyrene, and an inner jacket or lining 30 of thermally-conductive material such as silicone rubber, alumina or silicon nitride. Optionally, the housing wall 16a may include a transparent window 32 aligned with a camera lens 18a of CED 18, enabling controller 12 or a remote owner to obtain photo or video images in the vehicle cabin using the CED's internal camera, if so equipped. And as indicated in FIG. 1, the housing wall 16a is removable to allow user-access to the chamber 26 for insertion and removal of CED 18.

The TEM 20 is mounted in a housing wall 16b opposite the removable housing wall 16a, as illustrated in FIG. 1. TEM 20 is configured as an alternating arrangement of inter-connected p-type and n-type Peltier elements 34, 36 sandwiched between internal and external heatsinks 38 and 40. The internal heatsink 38 is thermally coupled to the inner jacket or lining 30 of housing 16, while the external heatsink 40 (which may be finned as shown) extends out of the housing 16 so as to be thermally coupled to ambient air surrounding the housing 16. Thermistor 22 and TEM 20 are coupled to electric cable 24 by an internal connection (not shown), and a pig-tail connector 24a is provided for electrical connection to CED 18. Thermistor 22 is disposed in the chamber 26, allowing controller 12 to periodically sample the temperature in chamber 26. Of course, another temperature-sensing device such as a thermocouple may be used in place of thermistor 22. Although the air temperature within chamber 26 can be controlled exclusively with TEM 20, it may be desirable in some applications to configure TEM 20 for cooling only, and to heat the CED 18, when required, by cyclically charging and discharging its internal storage battery via electric cable 24 (and pig-tail connector 24a).

Figure 3:
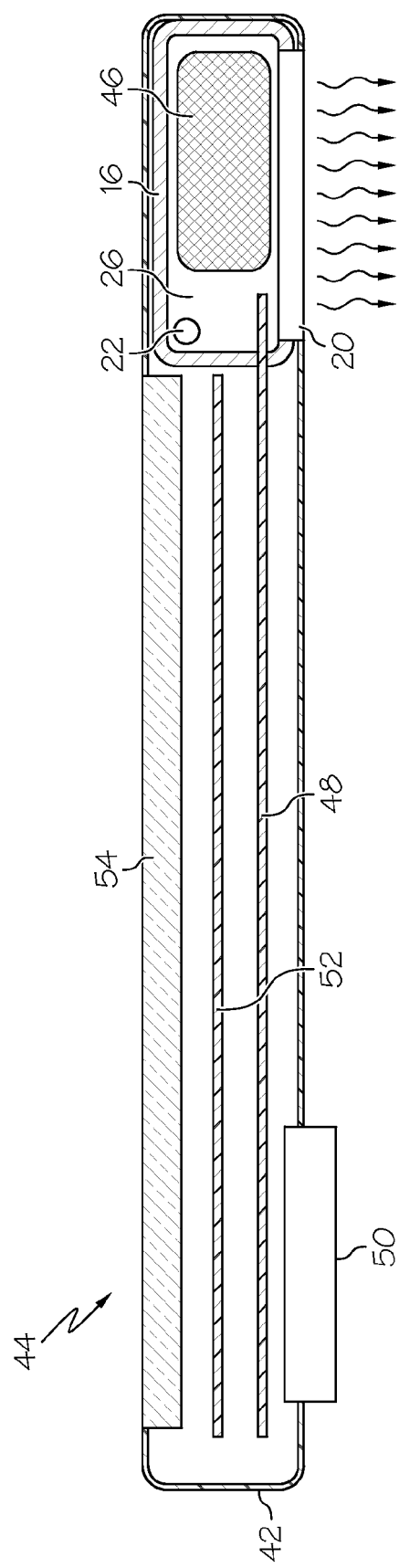
FIG. 3 is a cross-sectional view of an alternate embodiment, in which the housing of FIGS. 1-2 is integrated into the case of a consumer electronic device.

FIG. 3 depicts an alternate embodiment in which the housing 16 of thermal protection apparatus 10 is integrated into the case 42 of a larger CED 44. This approach can be used to cool selected components of a CED 44 rather than the entire device, thereby reducing the required power and the size of the TEM 20. In this case, CED 44 includes an internal battery 46 that cannot withstand extreme temperatures, and the battery 46 is received within the chamber 26 of housing 16; in other words, battery 46 is the thermally protected CED. Of course, other thermally sensitive components of CED 44 could be disposed within the chamber 26 of housing 16 if desired. TEM 20 and thermistor 22 of housing 16 are coupled to controller 12 via conductors (not shown) formed on an internal circuit board 48 of CED 44 and a docking connector 50 integrated into the case 42 of CED 44. And the docking connector 50 mates with a corresponding dock or cradle (not shown) provided in the vehicle cabin or storage compartment. In the illustration of FIG. 3, CED 44 further includes an auxiliary circuit board 52 and a large display 54.

Power for operating TEM 20 can be supplied directly from controller 12 and power supply 14 as described above, or indirectly through the internal battery 46. The latter configuration presents a possibility of using internal battery 46 to power TEM 20, but this is not considered to be desirable due to its impact on battery charge.

Figure 4:
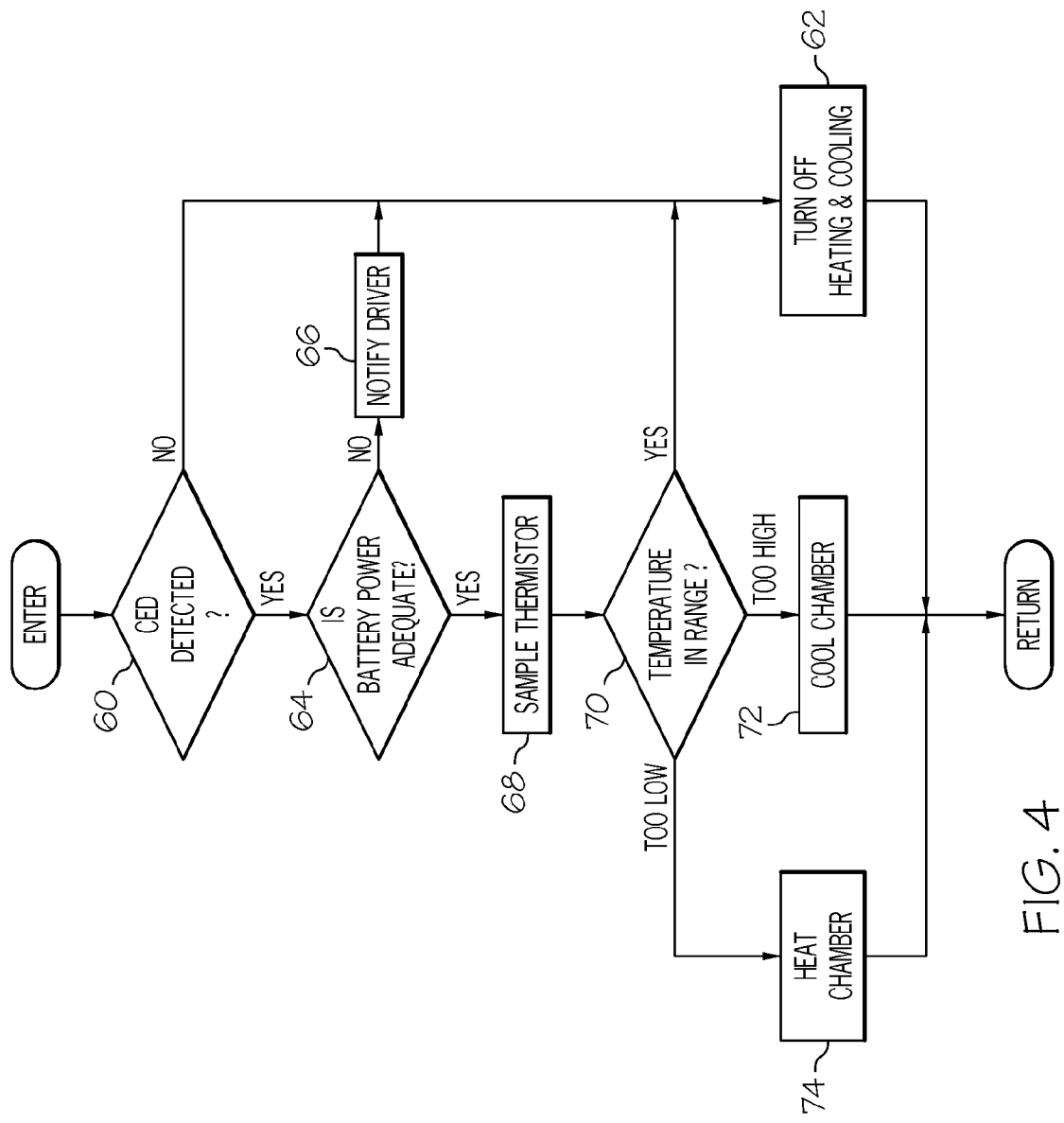
FIG. 4 is a flow diagram representing a software routine executed by the remote electronic controller of FIG. 1 according to this invention.

FIG. 4 depicts a simplified flow diagram representing a software routine periodically executed by controller 12 in carrying out the above-described thermal regulation. On entering the routine, controller 12 first executes block 60 to determine if a CED 18 is plugged into the pig-tail connector 24a; this step pertains to the embodiment of FIGS. 1-2, and effectively determines if CED 18 has been placed in the chamber 26. If block 60 is answered in the negative, block 62 is executed to turn-off TEM 20 before exiting the routine. If block 60 is answered in the affirmative, block 64 is executed to determine if adequate vehicle battery power exists to operate TEM 20. If not, block 66 notifies the driver that the battery energy reserve is inadequate to control the temperature in chamber 26, and block 62 turns off TEM 20 before exiting the routine. The driver notification can be carried out in various ways, such as by flashing a warning lamp or using CED 18 to transmit an appropriate text message to the driver's cell phone. If the battery power is adequate to operate TEM 20, blocks 68 and 70 are executed to sample thermistor 22 and determine if the chamber temperature is within the allowable range of temperatures. If so, block 62 is executed as above to turn-off TEM 20 before exiting the routine. However, if the sampled temperature exceeds a prescribed maximum operating temperature for CED 18, block 72 is executed to activate TEM 20 to cool the chamber 26 and its contents. And if the sampled temperature is below a prescribed minimum operating temperature of CED 18, block 74 is executed to heat the chamber 26 and its contents, either by suitable activation of TEM 20 or by cyclically charging and discharging the internal battery of CED 18 to dissipate heat. As soon as the sampled temperature returns within the allowable range of temperatures, block 70 directs the execution of block 62 to turn-off TEM 20 (and to terminate cyclic battery charging and discharging, if any) before exiting the routine.

In summary, the thermal protection apparatus 10 of the present invention provides a simple and reliable means of preventing damage to thermally sensitive CEDs in unattended vehicles subject to extreme temperatures beyond the design limits of the CED. While the present invention has been described with respect to the illustrated embodiment, it is recognized that numerous modifications and variations in addition to those mentioned herein will occur to those skilled in the art. For example, the electronic controller 12 can be configured for wireless communication with CED 18 by a short-range wireless communication protocol such as Bluetooth or WiFi, and so on. Accordingly, it is intended that the invention not be limited to the disclosed embodiment, but that it have the full scope permitted by the language of the following claims.

The invention claimed is:

1. Vehicular thermal-protection apparatus for a user-provided consumer electronic device, comprising:
    a housing enveloping a chamber in which the consumer electronic device is received, the housing including an outer jacket of thermally-insulative material, an inner jacket of thermally-conductive material lining said chamber, and a removable panel enabling user-access to the chamber for insertion and removal of the consumer electronic device;
    a thermoelectric module mounted in a sidewall of said housing, said thermoelectric module being thermally coupled to said inner jacket and including an external heatsink thermally coupled to ambient air surrounding said housing;
    a sensor disposed in said chamber for sensing a temperature in said chamber;

an electrical cable passing through said housing, and electrically coupled to said thermoelectric module, said sensor, and said consumer electronic device; and a remote electronic controller and power source coupled to said electrical cable for activating said thermoelectric module with said power source in a manner to prevent a temperature in said chamber from exceeding a prescribed maximum operating temperature of the consumer electronic device or falling below a prescribed minimum operating temperature of the consumer electronic device.

2. The vehicular thermal-protection apparatus of claim 1, where:

said thermally insulative material and said thermally conductive material are both radio-frequency energy transmissive; and said consumer electronic device is a radio frequency communication device.

3. The vehicular thermal-protection apparatus of claim 1, where:

said housing is disposed within a case of a secondary consumer electronic device to thermally protect one or more selected components of said secondary consumer electronic device.

4. The vehicular thermal-protection apparatus of claim 3, further where:

said selected components of said secondary consumer electronic device include an internal battery of said secondary consumer electronic device.

5. The vehicular thermal-protection apparatus of claim 1, where:

said housing is mounted in a cabin of the vehicle;

said consumer electronic device includes a camera lens; and said housing includes a window of transparent material in alignment with the camera lens to allow the consumer electronic device to capture an image of said cabin.

6. The vehicular thermal-protection apparatus of claim 1, further comprising:

a mechanism by which said remote electronic controller notifies a vehicle driver that said power source has inadequate energy to activate said thermoelectric module.

7. The vehicular thermal-protection apparatus of claim 6, where:

said consumer electronic device is a radio frequency communication device; and said mechanism is a radio frequency transmitter of said consumer electronic device.

8. The vehicular thermal-protection apparatus of claim 1, where:

said consumer electronic device includes an internal battery; and said remote electronic controller utilizes said electrical cable to cyclically charge and discharge said internal battery to dissipate heat as required to prevent the temperature in said chamber from falling below said prescribed minimum operating temperature.

* * * * *